(12) United States Patent
Yamada et al.

(10) Patent No.: US 7,431,158 B2  
(45) Date of Patent: Oct. 7, 2008

(54) FLEXIBLE SUBSTRATE STORAGE EQUIPMENT AND FLEXIBLE SUBSTRATE STORING METHOD

(75) Inventors: Kimihiko Yamada, Yamatokoriyama (JP); Yoshiki Nakatani, Nara (JP); Tetsuya Aita, Sakai (JP)

(73) Assignee: Sharp Kabushiki Kaisha, Osaka (JP)

( * ) Notice: Subject to any disclaimer, the term of this patent is extended or adjusted under 35 U.S.C. 154(b) by 364 days.

(21) Appl. No.: 10/779,693

(22) Filed: Feb. 18, 2004

(65) Prior Publication Data

US 2004/0163988 A1  Aug. 26, 2004

(30) Foreign Application Priority Data

Feb. 21, 2003 (JP) ............................. 2003-045059

(51) Int. Cl.
*B65D 85/48* (2006.01)
(52) U.S. Cl. .................. 206/454; 206/449; 206/448; 211/41.1
(58) Field of Classification Search ......... 206/710–712, 206/723, 832, 833, 449, 454, 448, 455
See application file for complete search history.

(56) References Cited

U.S. PATENT DOCUMENTS

| | | | | |
|---|---|---|---|---|
| 2,807,360 A | * | 9/1957 | Nurre | 206/448 |
| 3,828,726 A | * | 8/1974 | Dietze et al. | 118/500 |
| 5,236,094 A | * | 8/1993 | Condie | 211/41.17 |
| 5,588,531 A | | 12/1996 | Yoshida et al. | |
| 6,273,275 B1 | * | 8/2001 | Kim et al. | 211/41.18 |
| 6,527,120 B2 | * | 3/2003 | Okamoto | 206/454 |
| 2003/0085145 A1 | | 5/2003 | Okamoto | |

FOREIGN PATENT DOCUMENTS

| | | |
|---|---|---|
| JP | 8-53176 A | 2/1996 |
| JP | 0-92713 A | 4/1997 |
| JP | 9-92713 A | 4/1997 |
| JP | 120074/1998 | 5/1998 |
| JP | 322056/1998 | 12/1998 |
| JP | 2002-264992 A | 9/2002 |

* cited by examiner

*Primary Examiner*—Jila M Mohandesi
(74) *Attorney, Agent, or Firm*—Nixon & Vanderhye P.C.

(57) ABSTRACT

A flexible substrate storage equipment of the present invention includes at least a pair of opposed members that constitute an outer frame of a storage equipment main body, wherein the pair of opposed members are disposed so as to maintain a predetermined interval to wedge a plurality of flexible substrates in between to hold them in a shape of a curve. As a result, a flexible substrate storage equipment for surely storing and holding a plastic substrate or other flexible substrate with a simple structure, and a storing method of such substrate can be realized.

23 Claims, 16 Drawing Sheets

Wc>Wd $0° < \theta a < 90°$
$90° < \theta a < 180°$ $\theta b \neq 180°$

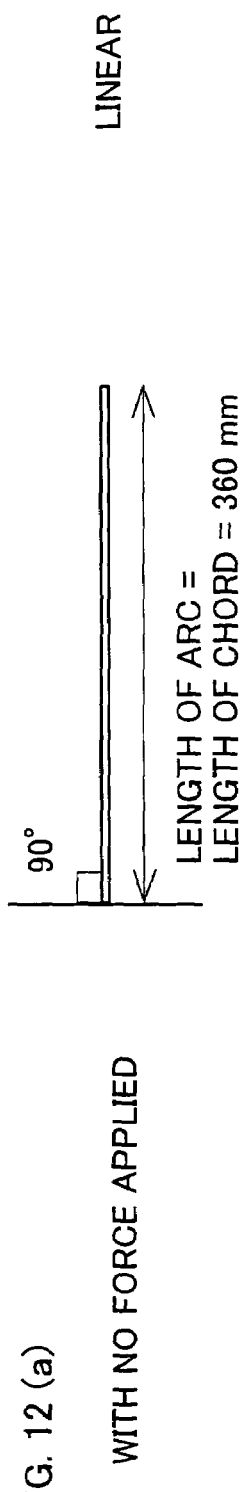

FIG. 12 (a)
WITH NO FORCE APPLIED

State of plastic substrate: 90°, LENGTH OF ARC = LENGTH OF CHORD = 360 mm

Shape of substrate when seen from above: LINEAR

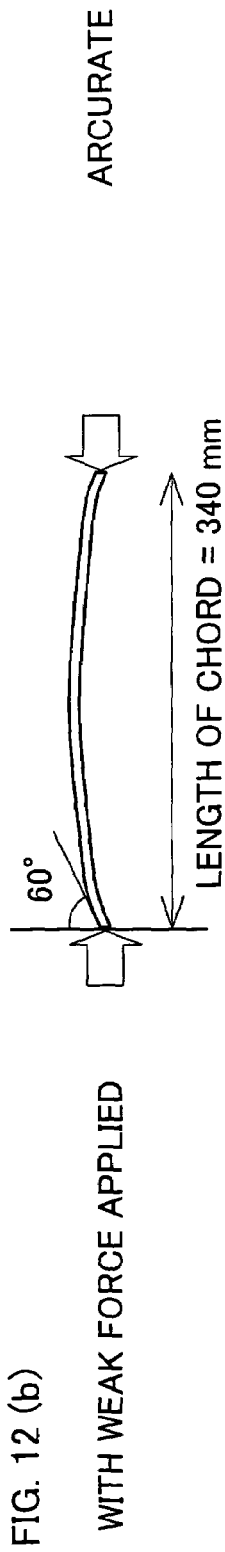

FIG. 12 (b)
WITH WEAK FORCE APPLIED

State of plastic substrate: 60°, LENGTH OF CHORD = 340 mm

Shape of substrate when seen from above: ARCURATE

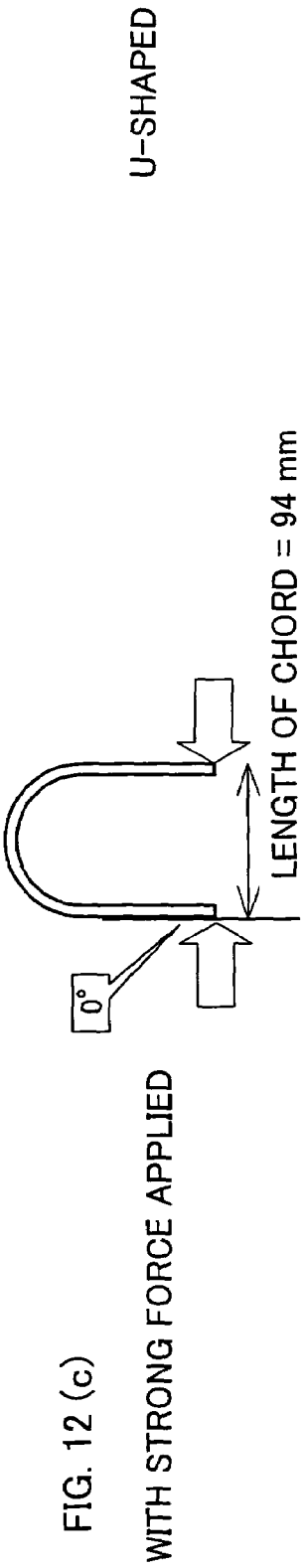

FIG. 12 (c)
WITH STRONG FORCE APPLIED

State of plastic substrate: 0°, LENGTH OF CHORD = 94 mm

Shape of substrate when seen from above: U-SHAPED

FIG. 13

PLASTIC SUBSTRATE 360 mm (WIDTH) × 465 mm (LENGTH) × 0.2 mm (THICKNESS)

| INITIAL STATE | SUBSTRATE IN CURVED SHAPE | | STATE OF SUBSTRATE AFTER BEING RELEASED FROM WEDGED STATE IN CURVED SHAPE | COMPREHENSIVE EVALUATION |
|---|---|---|---|---|
| SUBSTRATE WIDTH | ANGLE θ pls | STABILITY | | |
| 360 | 90 | × | ○ | × |
| 358 | 76 | △ | ○ | △ |
| 355 | 69 | ○ | ○ | ○ |
| 350 | 67 | ○ | ○ | ○ |
| 340 | 60 | ○ | ○ | ○ |
| 320 | 54 | ○ | ○ | ○ |
| 300 | 44 | ○ | ○ | ○ |
| 280 | 35 | ○ | ○ | ○ |
| 260 | 33 | ○ | ○ | ○ |
| 210 | 19 | ○ | × | × |
| 160 | 3 | ○ | × | × |
| 160 | 2 | ○ | × | × |
| 94 | 0 | ○ | × | × |

IN CONCLUSION, 20° TO 70° IS PREFERABLE.

○: SUBSTRATE IS STABLY SELF-SUPPORTED.
△: SUBSTRATE IS UNSTABLE AND IS NOT SELF-SUPPORTED (ITS STABILITY IS BETTER THAN ×.)
×: SUBSTRATE IS COMPLETELY NO SELF-SUPPORTED.

○: SUBSTRATE IS FORMED BACK IN ORIGINAL SHAPE BEFORE BEING CURVED.
×: SUBSTRATE HAS A HABIT IN CURVED SHAPE.

FIG. 14

GLASS SUBSTRATE
360 mm (WIDTH) × 465 mm (LENGTH) × 0.7 mm (THICKNESS)

| SUBSTRATE WIDTH | SUBSTRATE IN CURVED SHAPE | | STATE OF SUBSTRATE AFTER BEING RELEASED FROM WEDGED STATE IN CURVED SHAPE | COMPREHENSIVE EVALUATION |
|---|---|---|---|---|
| | ANGLE θ pls | STABILITY | | |
| 360 | 90 | ○ | ○ | ○ |
| 358 | 79 | ○ | ○ | ○ |
| 355 | — | × | × | × |

○: SUBSTRATE IS STABLY SELF-SUPPORTED.
×: SUBSTRATE IS CRASHED.

○: SUBSTRATE IS FORMED BACK IN ORIGINAL SHAPE BEFORE BEING FORMED IN CURVED SHAPE.
×: SUBSTRATE IS CRUSHED, AND IS NOT FORMED BACK INTO ORIGINAL SHAPE BEFORE BEING FORMED IN CURVED SHAPE.

FIG. 15 (a) (Prior Art)
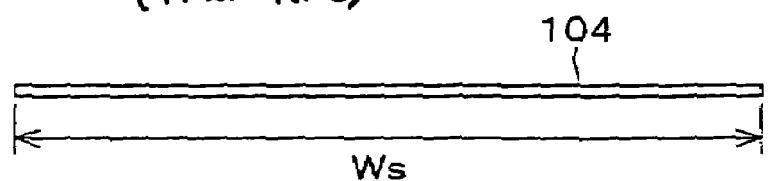
FIG. 15 (b) (Prior Art)
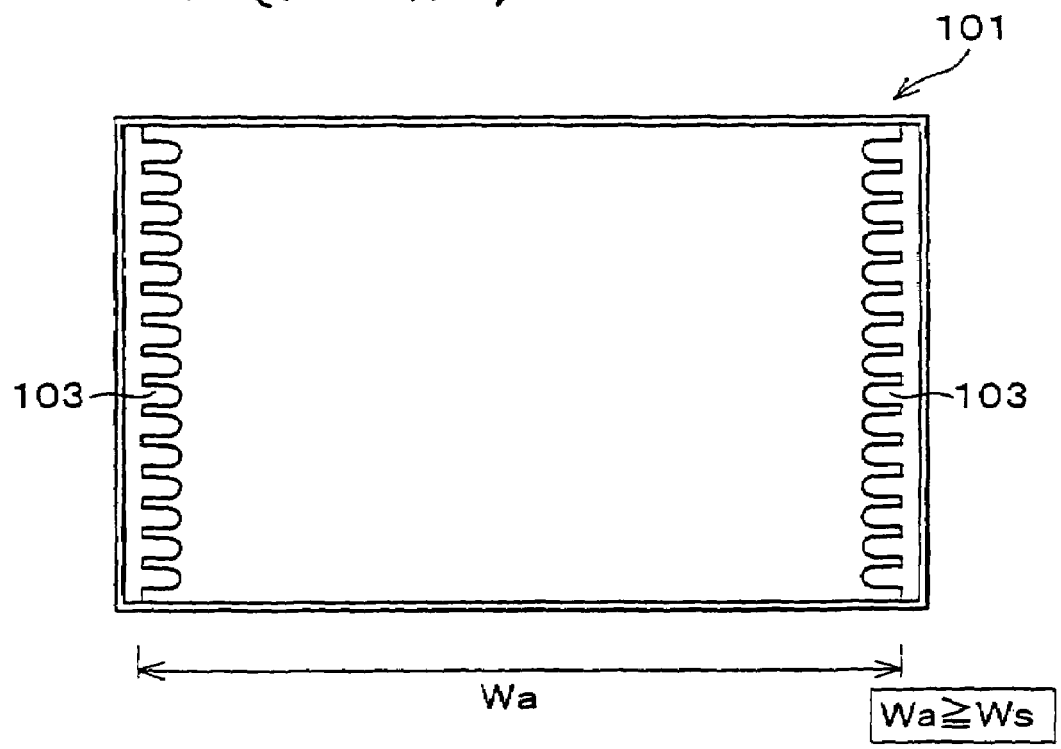
$Wa \geqq Ws$ θa = 90°

FLEXIBLE SUBSTRATE STORAGE EQUIPMENT AND FLEXIBLE SUBSTRATE STORING METHOD

This non-provisional application claims priority under 35 U.S.C. §119(a) on Patent Application No. 2003/45059 filed in Japan on Feb. 21, 2003, the entire contents of which are hereby incorporated by reference.

FIELD OF THE INVENTION

The present invention relates to a flexible substrate storage equipment for storing various types of substrates in a form of a thin plate or a sheet, or complete panels, etc., prepared using these substrates (glass substrate, plastic substrate, metallic foil, etc.,) for use in liquid crystal display, electro-luminescent display, plasma display, fluorescent display tube, color filter, solar battery, etc., and also relates to a storing method of such flexible substrates.

BACKGROUND OF THE INVENTION

Liquid crystal display devices are flat thin display devices which are most typically used for various OA apparatus terminal equipments, liquid crystal TVs, etc. For liquid crystal display devices, glass substrates are generally adopted, and for the storage and transport purpose of these glass substrates (including complete panels) to carry them between glass substrate manufactures and liquid crystal panel manufactures, glass substrate storage containers made of foamed resin material are generally used.

Japanese Laid-Open Patent Publication No. 7-132986/1995 (Tokukaihei 7-132986/1995, published on May 23, 1995) (U.S. Pat. No. 5,588,531, Date of patent: Dec. 31, 1996) discloses a glass substrate storage container made up of a storage container main body with a bottom surface and a lid member, wherein a pair of opposed side plates of the storage container main body has a plurality of holding members for holding the glass substrates in parallel in a stand position or a horizontal position so that respective glass substrates do not contact each other.

Specifically, as illustrated in FIG. 15(a) and FIG. 15(b), a glass substrate 104 having a thickness of 0.7 mm or a thickness of 1.1 mm generally used in the field of liquid crystal display is stored in a substrate storage container 101. This substrate storage container 101 includes holding members 103 formed on a pair of opposed inner faces so as to hold the glass substrates 104 in parallel so that respective glass substrates 104 do not contact in a vertical direction. Each glass substrate 104 is inserted in a space between the opposed two holding members 103 to be stored in the substrate storage container 101.

As illustrated in FIG. 16, an angle of hold θa formed by each holding member 103 and the inner side face of the substrate storage container 101 is generally 90°.

Another structure of the substrate storage container is disclosed, for example, by Japanese Laid-Open Publication No. 10-120074/1998 (Tokukaihei 10-120074) published on May 12, 1998 wherein in a container for storing a plurality of LCD panels of different sizes in a lateral direction, holding members formed on at least one of the side faces for holding the LCD panels are sloped downwards. Here, each substrate stored in the container is held in a shape of a curve by its deadweight. Furthermore, the LCD panel shown in FIG. 17 is merely hanged on the holding members, and the side ends of the LCD panel do not contact the side walls of the container.

On the other hand, Japanese Laid-Open Patent Publication No. 10-322056/1998 (Tokukaihei 10-322056) published on Dec. 4, 1998 discloses the structure wherein a substrate cassette width can be increased/reduced according to the size of the substrates to be stored.

SUMMARY OF THE INVENTION

It is an object of the present invention to provide a flexible substrate storage equipment for stably storing and holding a plastic substrate or other flexible substrate, etc., with a simple structure, and to provide a flexible substrate storing method.

In order to achieve the foregoing object, the flexible substrate storage container of the present invention includes:

at least a pair of opposed members that constitute an outer frame of an equipment main body, wherein said pair of opposed members are disposed so as to maintain a predetermined interval to wedge a plurality of flexible substrates in between to hold them in a shape of a curve.

A flexible substrate is stored by a storing method of flexible substrates, wherein a plurality of flexible substrates are wedged in between a pair of opposed members which constitute an outer frame of an equipment main body.

According to the present invention, a plurality of flexible substrates are stored in a shape of a curve. For this reason, the substrate becomes less flexible due to an increase in flexural rigidity, and the substrate becomes firmer. As a result, the substrate is liable to be self-supported. It is therefore possible to stably store the substrate in the storage container main body under stable conditions.

As a result, a flexible substrate storage equipment for storing and holding a plastic substrate or other flexible substrate, etc., with a simple structure under stable conditions, and a flexible substrate storing method can be realized.

For a fuller understanding of the nature and advantages of the invention, reference should be made to the ensuing detailed description taken in conjunction with the accompanying drawings.

BRIEF DESCRIPTION OF THE DRAWINGS

FIG. 1(a) through FIG. 1(d) show a storage container main body in accordance with one embodiment of the present invention, wherein FIG. 1(a) is a plan view of a substrate in a flat state to be stored in the storage container main body, FIG. 1(b) is a plan view which shows a state where substrates are stored in the storage container main body in a shape of a curve, and FIG. 1(c) is a plan view of the storage container main body, FIG. 1(d) is an enlarged plan view of essential parts of the storage container main body showing the state where the substrate is wedged in between the side plates while being held by the holding members.

FIGS. 6(a) and 6(b) show a flexible substrate storage equipment in accordance with another embodiment of the present invention, wherein FIG. 6(a) is a front view of a substrate storage cassette in a state where an interval between a pair of connection bars is increased, and FIG. 6(b) is a front view illustrating a substrate storage cassette in a state where an interval between the pair of connection bars is reduced.

FIGS. 8(a) through 8(c) show a storage container main body in accordance with still another embodiment of the present invention, wherein FIG. 8(a) is a plan view showing a substrate at a flat position that is to be stored in the storage container main body, FIG. 8(b) is a plan view illustrating the substrate stored in the storage container main body in a shape of a curve, and FIG. 8(c) is a plan view illustrating the storage container main body wherein curved grooves are formed in the base plate.

FIGS. 10(a) and 10(b) show a storage container main body in accordance with still another embodiment of the present invention, wherein FIG. 10(a) is a plan view which shows a substrate stored in the storage container main body at a flat position, FIG. 10(b) is a plan view illustrating a substrate stored in the storage container main body in a shape of a curve, and FIG. 10(c) is a plan view illustrating the storage container main body provided with a plurality of protrusions formed on the bottom face.

FIGS. 12(a) through 12(c) show results of experiments in determining an angle of inclination of the holding members of the storage container main body in accordance with the present invention, wherein FIG. 12(a) is a front view illustrating the substrate without applied thereto a weak compressive force in an axial direction, FIG. 12(b) is a front view illustrating the substrate with a weak compressive force applied in an axial direction, and FIG. 12(c) is a front view illustrating the substrate with a strong compressive force applied in an axial direction.

FIG. 13 is a characteristic diagram illustrating the results of an experiment for use in determining an angle of inclination of a holding member of the storage container main body in the case of a plastic substrate.

FIG. 14 is a characteristic diagram illustrating the results of an experiment for use in determining an angle of inclination of a holding member of the storage container main body in the case of the glass substrate.

FIGS. 15(a) and 15(b) show a conventional storage container, wherein FIG. 15(a) is a plan view showing a substrate to be stored in the storage container main body in a flat state, and FIG. 15(b) is a plan view illustrating the storage container main body.

DESCRIPTION OF THE EMBODIMENTS

First Embodiment

The following descriptions will explain one embodiment of the present invention in reference to FIGS. 1(a) to 1(d), and FIG. 2 to FIG. 5.

Figure 1:
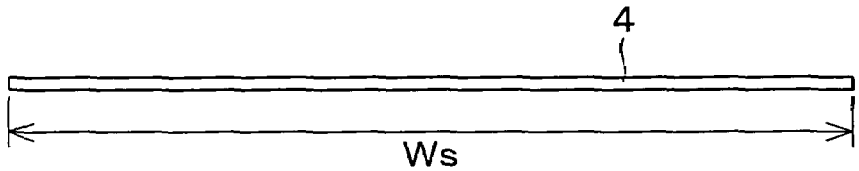
Figure 1:
Figure 1:
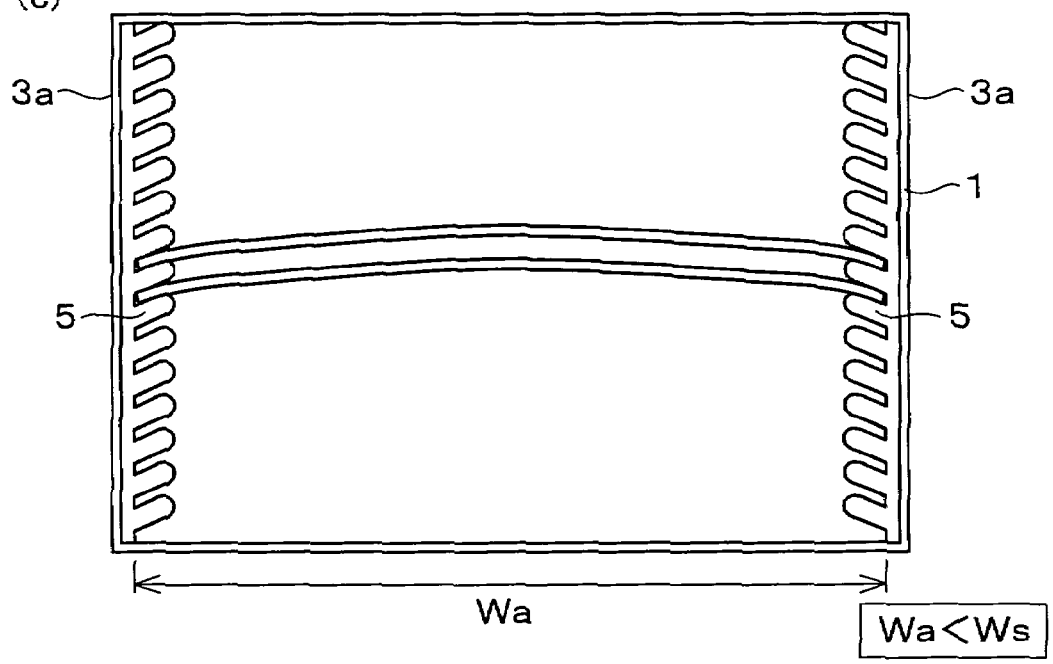
Figure 1:
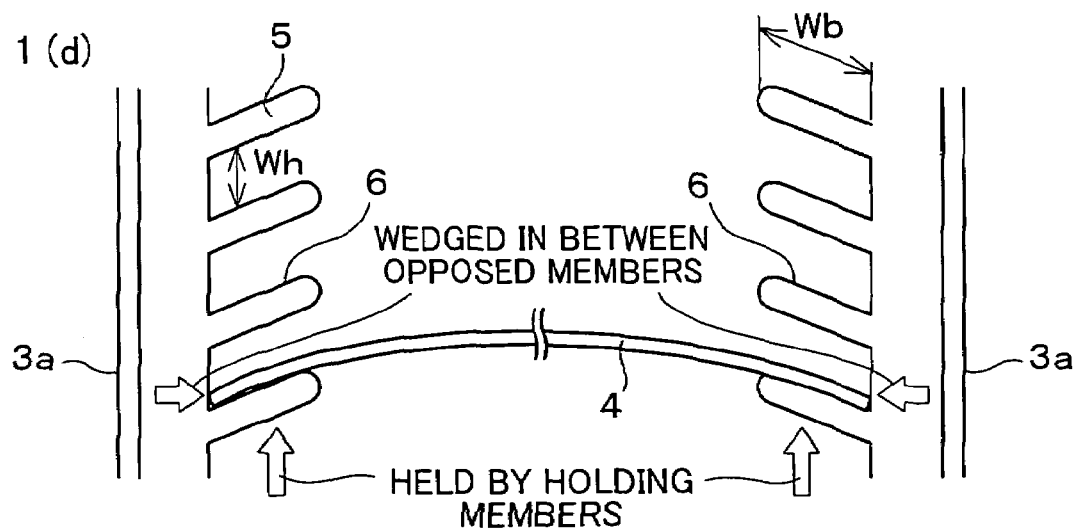
Figure 2:
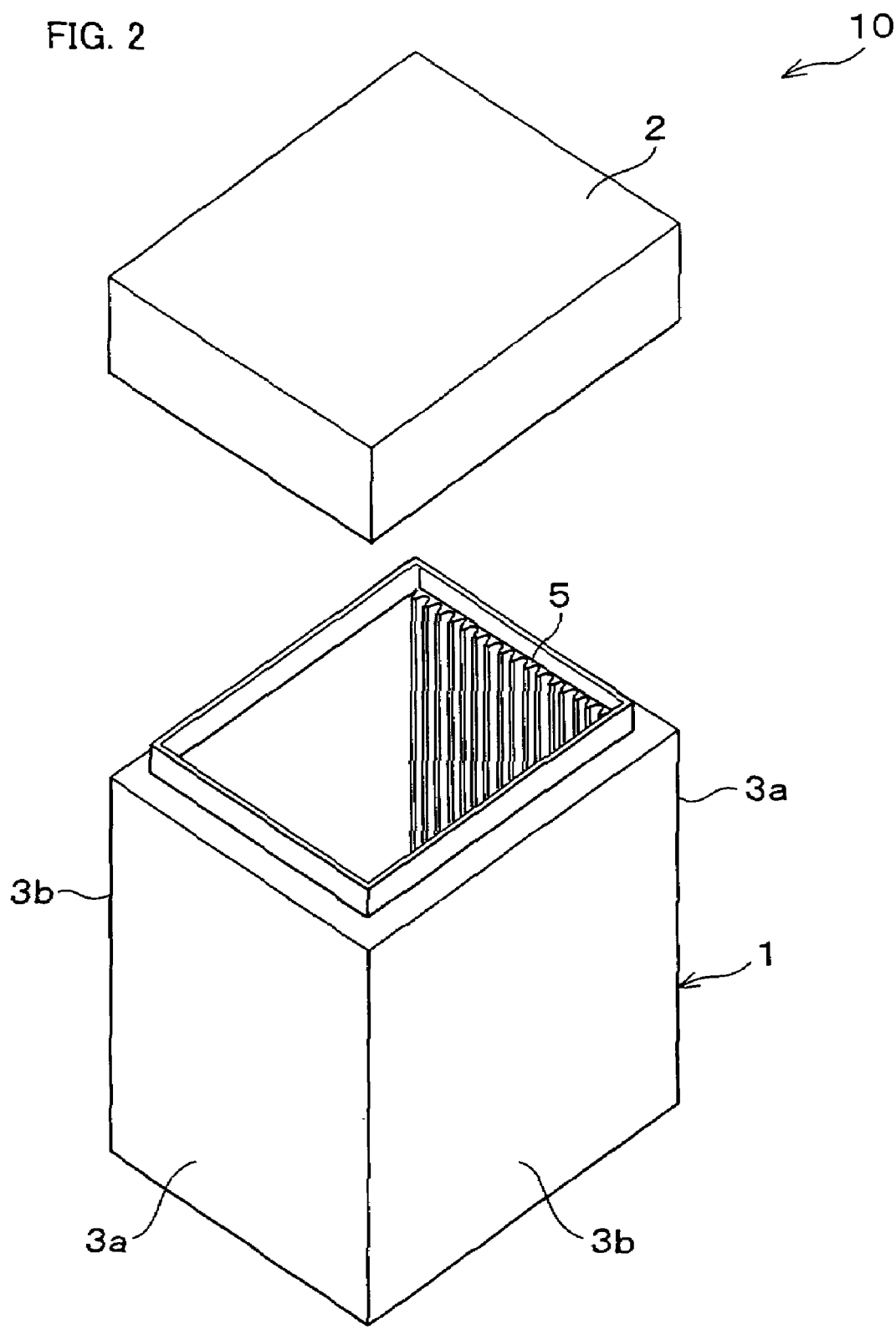
FIG. 2 is a perspective view illustrating the storage container main body and the lid member of the substrate storage container.

As illustrated in FIG. 2, a flexible substrate storage container 10 in accordance with the present embodiment includes a storage container main body (flexible substrate storage equipment) 1 and a lid member 2. This storage container main body 1 includes at least a pair of side plates 3a which are disposed so as to oppose each other. These side plates 3a are supported by the other pair of side plates 3b to maintain a predetermined interval in between.

Figure 3:
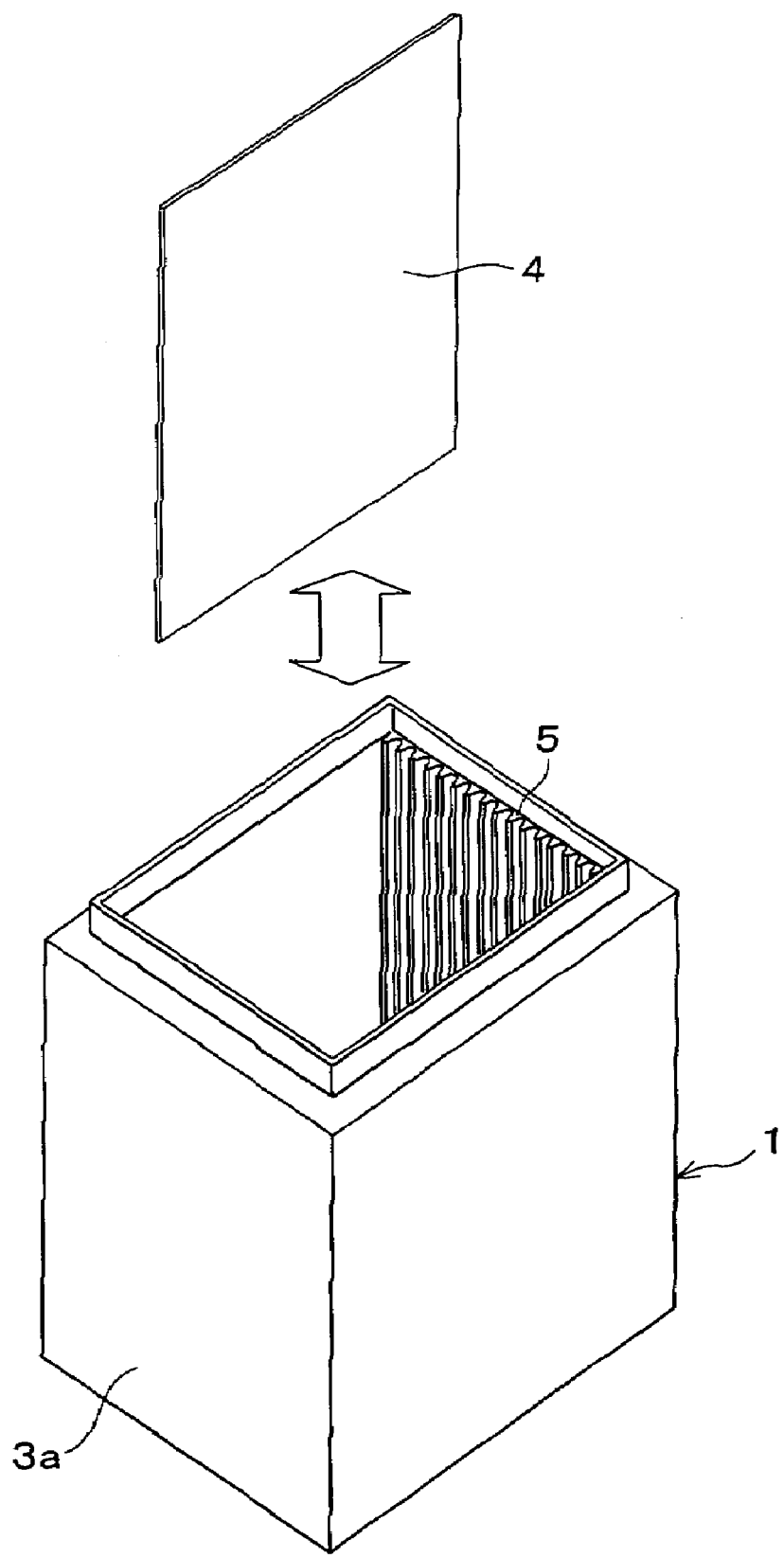
FIG. 3 is a perspective view illustrating the state where a substrate is to be inserted into the storage container main body.

As illustrated in FIG. 3, a plurality of flexible substrates 4 are inserted and stored in an upright position in the storage container main body 1. For example, in a manufacturing line of a liquid crystal display, etc., ten to several tens thin glass substrates (flexible substrates) are stored in the storage container 1. For example, the flexible substrate is not necessarily be a thin glass substrate, and the flexible substrate can be, for example, a plastic substrate or other flexible substrate. The substrate 4 of the present embodiment is a plastic substrate made of a resin material or a composite material of resin and inorganic material. This substrate 4 is formed 360 mm×465 mm in size and 0.2 mm in thickness. This plastic substrate 4 may be covered with a silicon nitride film. Incidentally, the size of the substrate 4 of the present embodiment in not intended to be limited to the above.

As illustrated in FIGS. 1(a), 1(b), 1(c) and 1(d), each substrate 4 is wedged in between the pair of side plates 3a as being pushed by these side plates 3a into a shape of a curve. Namely, "being wedged" is different from "being held". To be wedged indicates to be held as being pushed with applied forces in mutually opposite directions. In contrast, to be held indicates merely to be supported.

Namely, in the present embodiment, the substrate 4 is forced to be bent in a shape of a curve when stored. To realize this, an interval between the pair of side plates 3a, i.e., the width Wa of the storage container main body 1 is selected to be shorter than the length Ws of the substrate 4. The length Ws of the substrate is defined to be the length Ws of the substrate 4 in the direction of wedging the substrate 4 in the storage container main body 1. The width Wa of the storage container main body 1 is defined to be a width of the storage container main body 1 in the direction of wedging the substrate 4 in the storage container main body 1.

In the present embodiment, the substrate 4 is stored in a shape of a curve in consideration of such problem associated with the case of storing a thin substrate 4. That is, the thin substrate 4 has large flexibility and small rigidity, and therefore, for example, when storing the thin substrate 4 in flat state at an upright position, it is not possible to maintain the substrate 4 in the flat state or it is difficult (or not possible) to be stably self-supported.

According to the structure of the present invention, the flexural rigidity can be increased by storing the substrate 4 in a shape of a curve. As a result, each substrate 4 is liable to be self-supported, and can be stably stored in the storage container main body 1.

Specifically, the substrate having a curved cross section has a larger geometric moment of inertia than that having a rectangular cross section. The geometric moment of inertia I is adopted in the field of the strength of material, and is determined only by the shape of the cross section of an object irrespectively of the dynamical variable or quality of material, etc.

As a result, the flexural rigidity (modulus coefficient of longitudinal flexibility E×geometric moment of inertia I) indicative of the bending difficulty of the object increases, and the substrate 4 therefore becomes difficult to be bent. Namely, the flexibility of the substrate 4 is reduced, and becomes firmer. As a result, the substrate 4 becomes liable to be self-supported, and can be stably sorted in the storage container main body 1.

According to the present embodiment, each substrate 4 is wedged in between a pair of side plates 3a as being pushed by these side plates 3a and is forced to be bent in a shape of a curve. The structure wherein the substrate 4 is formed into a shape of a curve by its deadweight is outside the technical scope of the present invention.

As illustrated in FIGS. 1(a) to 1(d), each of the side plates 3a of the storage container main body 1 has a plurality of holding members 5 for holding in parallel a plurality of flexible substrates 4 in a shape of a curve so that the flexible substrates 4 do not contact each other when stored at stand position.

Figure 4:
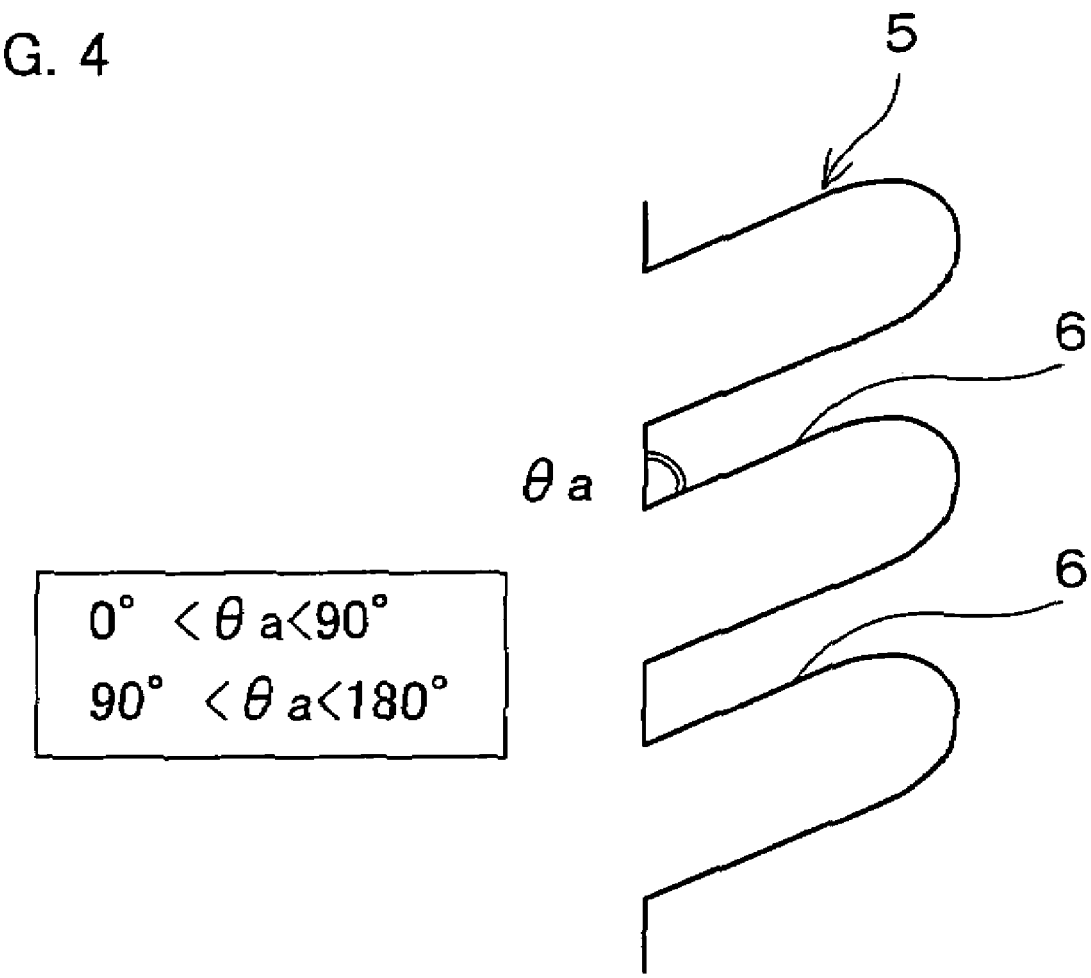
FIG. 4 is a plan view illustrating an angle of inclination of the substrate holding face in said holding member provided in said storage container main body.
Figure 5:
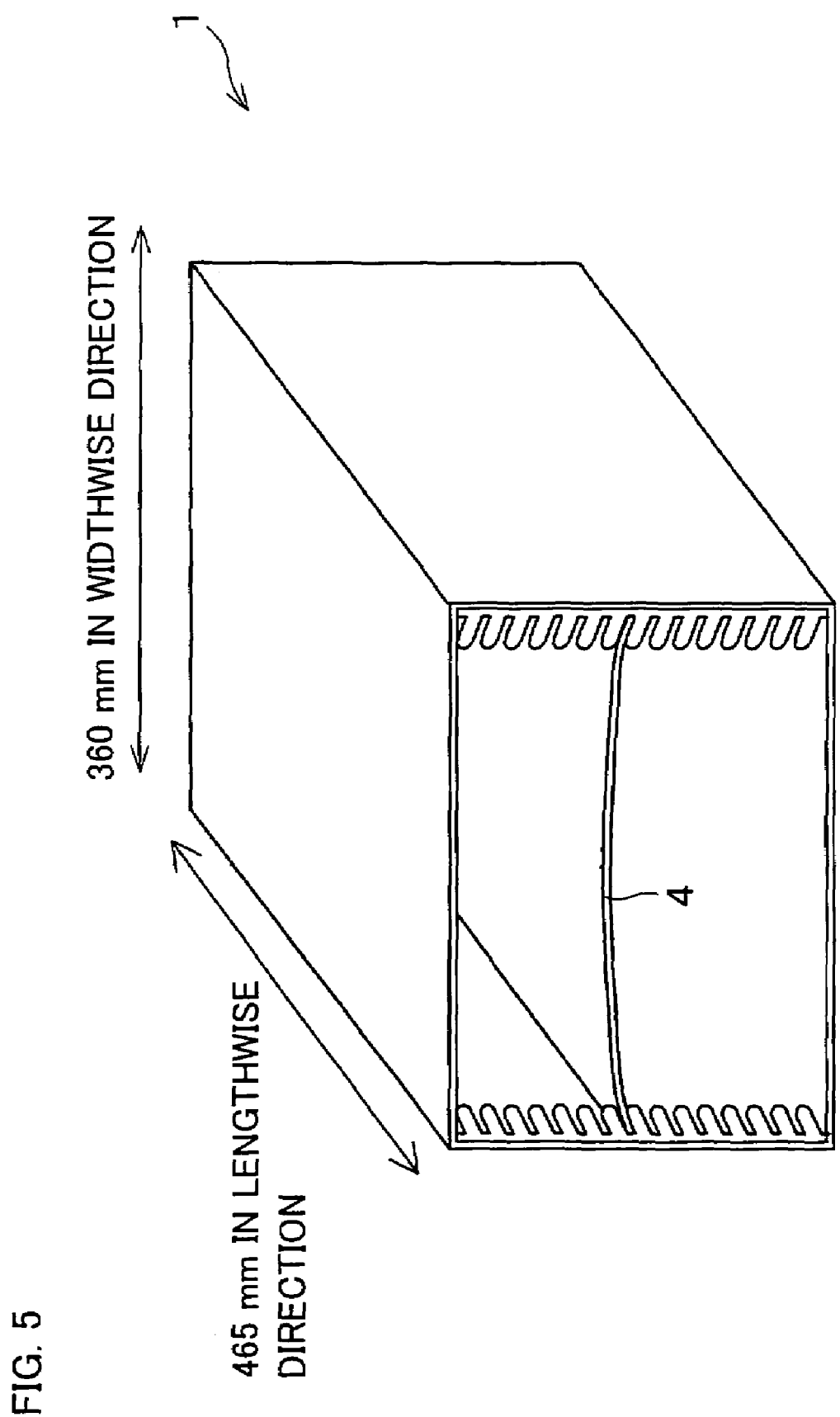
FIG. 5 is a perspective view illustrating the storage container main body in the state where the substrate is stored in a lateral direction.

As illustrated in FIG. 4, each substrate holding face 6 of the holding member 5 formed on the side plate 3a forms an angle of hold θa other than 90° with respect to the side plate 3a so that each flexible substrate 4 can be held in a form of a curve along the substrate holding face 6. Namely, the angle of hold θa of the substrate holding face 6 of the holding member 5 holds the substrate 4 so that the substrate 4 does not form a right angle with respect to the side plate 3a.

As described above, the flexural rigidity of a flat substrate 4 can be increased by bending the substrate 4 in a shape of a curve. As a result, each substrate 4 in a shape of a curve is liable to be self-supported as compared to that in a flat shape. In view of the foregoing, the angle of hold θa is selected to be an angle other than 90°, namely, in a range of 0°<θa<89°, and 91°<θa<180°.

However, since the substrate 4 is made of glass or plastic, and this substrate 4 is used, for example, in a liquid crystal display manufacturing line, if the substrate 4 is bent too much, the substrate 4 may be damaged, or a reaction force becomes large. In the present embodiment, it is therefore preferable that the angle of hold θa be selected in a range of 20° to 75° based on the results of experiment to be described later.

In order to bend the substrate 4 so that the angle of hold θa falls in the range of 20° to 75°, it is preferable that the substrate length Ws and the storage equipment main body width Wa hold the relationship of:

210/360<Wa/Ws<358/360.

With an appropriate selection of the relationship between the angle of hold θa or the substrate length Ws and the storage equipment main body width Wa, it is easy to hold the substrate 4 in a shape of a curve without being damaged, and a load on the substrate 4 and the holding member 5 can be reduced.

For example, the experiment was conducted under the following conditions, and all of the substrates 4 are stably self-supported in the storage container main body 1 without contacting each other.

Substrate length Ws: 360 mm
Storage equipment main body width Wa: 340 mm
Interval Wh between Groove of adjacent two holding members 5: 2 mm
Holding length Wb of the Holding member 5: 8 mm
Angle of hold θa of the substrate holding face 6: 60°
Size of Substrate 4 360 mm×465 mm.

On two substrates 4 made of plastic, formed are silicone nitride films generally adopted as gate insulating films or protective films of amorphous silicon TFT (Thin Film Transistor) liquid crystal display. Incidentally, the silicon nitride films are formed at a temperature of 200° C. using the plasma CVD method. The silicon nitride film has a thickness of 350 nm formed by this method has a membrane stress (tensile stress) of +270 Mpa.

An experiment was conducted with respect to a plastic substrate 4 having formed thereon a silicone nitride film by holding with hands the corner of one of the short sides (360 mm) of the substrate 4 so that the long sides (465 mm) were suspended downwards vertically. As a result, the film surface of the substrate 4 was wrapped by around 25 mm.

Then, two plastic substrates 4 respectively having formed thereon silicon nitride films were stored in the storage container main body 1 prepared in the following conditions, in a shape of a curve with the film surface convex.

Width Wd of storage container main body 1: 340 mm;
Interval Wh between grooves of two adjacent holding sections 5: 2 mm; and
Length of hold Wb of holding section 5: 8 mm; and
Angle of hold θa of the substrate holding face 6 of the holding member 5: 60°.

As a result, both of the plastic substrates 4 were stably self-supported in the storage container main body 1 without contacting each other. Incidentally, after storing the substrate 4 in the storage container main body 1, an occurrence of such problem as the separation of the silicone nitride film after the substrate 4 is stored in the storage container main body 1 can be prevented.

As described, the substrates 4 are more liable to be self-supported and can be more stably stored in the storage container main body 1. This structure 4 is free from the following problem. That is, the substrate 4 becomes bent down, non-independent or fallen off from the holding members 5 or damaged as being in contact with each other in the storage container main body 1.

The storage container main body 1 having the foregoing structure is therefore suited for storing a flexible plastic substrate and a plastic substrate having formed thereon a silicon nitride film.

In the present embodiment, explanations have been given through the case of the structure wherein the substrates 4 are stored in the storage container main body 1 at a stand position. However, the present embodiment is not intended to be limited to the foregoing structure, and, for example, the structure shown in FIG. 5 wherein the substrate 4 is stored in the storage container main body 1 in a lateral direction may be adopted. With this structure, it is possible to store the substrates 4 in a lateral direction in a shape of a curve.

As described, the storage container main body 1 of the present embodiment is arranged such that at least a pair of opposed members that constitute the outer frame of the storage container main body 1 are disposed so as to maintain a predetermined interval to wedge the plurality of flexible substrates 4 in between to hold them in a shape of a curve.

The storing method of a flexible substrate of the present embodiment is arranged such that the plurality of flexible substrates 4 are wedged in between a pair of opposed side plates 3a which constitute the outer frame of the storage container main body 1.

According to the present invention, the plurality of flexible substrates 4 are stored in a form of a curve. For this reason, the substrates 4 become less flexible due to an increase in flexural rigidity of the substrates, and the substrate 4 becomes firmer in its storage position. As a result, the substrate 4 is liable to be self-supported, and can be stably sorted in the storage container main body 1.

As a result, the storage container main body 1 and the flexible substrate storing method for stably storing and holding plastic substrates 4 or other flexible substrates 4, etc., can be realized with a simple structure.

The storage substrate main body 1 of the present embodiment is further arranged such that the predetermined interval between the pair of opposed side plates 3a in a state of holding the plurality of flexible substrates 4 is selected to be shorter than a length of the plurality of substrates 4 in a wedging direction.

The flexible substrate storing method of the present embodiment is further arranged such that the predetermined interval between the pair of opposed members in a state of holding the plurality of flexible substrates 4 is selected to be shorter than the length of each of the plurality of substrates 4 in a holding direction. Therefore, when storing the substrates 4 in the storage container main body 1, the substrates 4 are inevitably formed into a shape of a curve. As a result, it is possible to provide the storage equipment main body and the flexible substrate storing method that permit each of the substrates 4 to be stored in a shape of a curve with ease with a simple structure.

The storage container main body 1 of the present embodiment includes a plurality of holding members 5 provided at each of the opposed side plates 3a, for holding the plurality of substrates 4 in alignment. With this structure, it is possible to neatly store the plurality of substrates 4 as aligned.

The storage container main body 1 of the present embodiment is provided with the holding members 5 for holding the substrate 4 so as not to form a right angle with respect to the side plates 3a. Therefore, by selecting an angle formed between the pair of opposed side plates 3a and the substrate holding face 6 of the holding member 5 to be an angle other than 90°, the substrate 4 in a form of a curve can be more easily supported along the curve of the holding member 5. As a result, the substrate 4 can be more easily maintained in a form of a curve, and a load on the substrate 4 and the holding member 5 at a contact portion can be reduced. Also, generation of dust particles due to friction between the substrate 4 and the holding members 5 at a contact portion can be suppressed.

The storage container main body 1 of the present embodiment is arranged so as to store the substrates 4 at a stand position. With this structure, when storing the substrates 4, bending them in a form of a curve can increase the rigidity of the substrates 4. It is therefore possible to stably store the substrates 4 independently. In particular, this structure is effective for carrying the substrates 4 stored in the storage container main body 1.

In the present embodiment, the storage container main body 1 adopts the pair of flat side plates 3a, and the storage container main body 1 can be used as a flexible substrate storage container.

It is possible to provide a flexible substrate container which is easy to carry.

Second Embodiment

Figure 6:
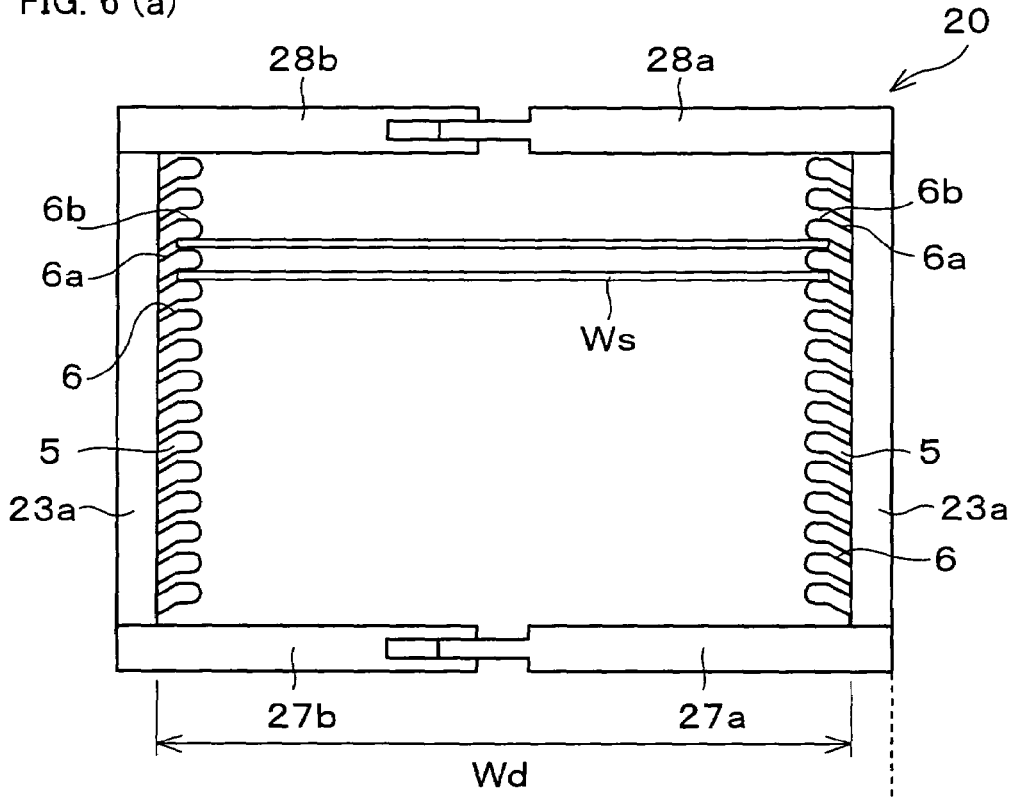
Figure 6:
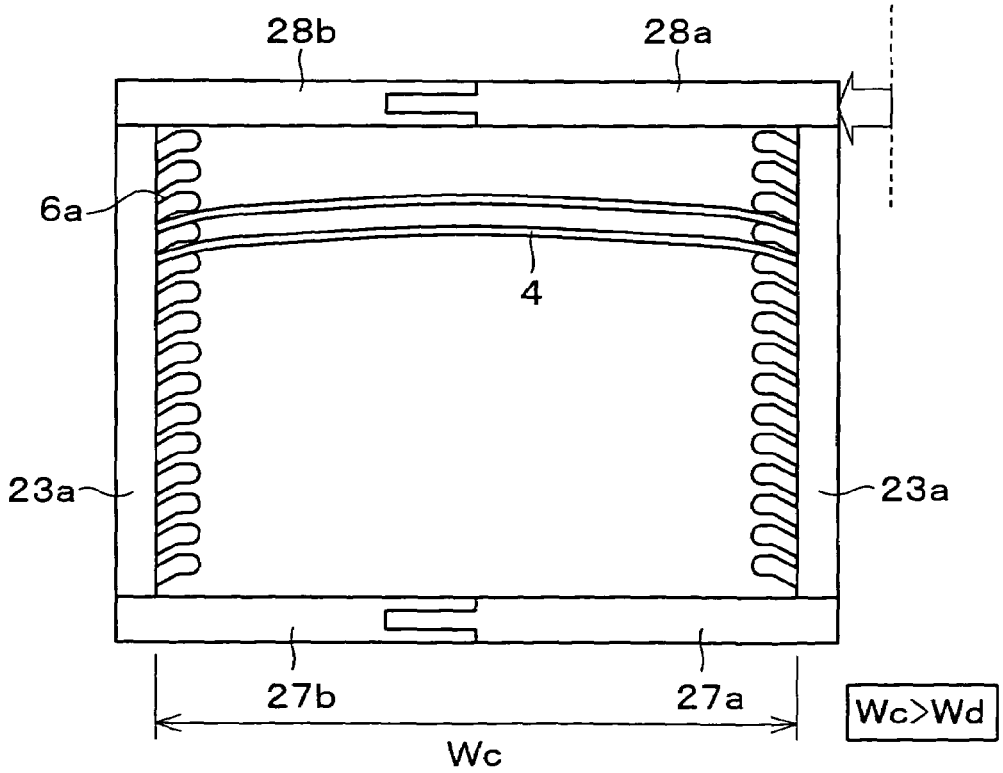
Figure 7:
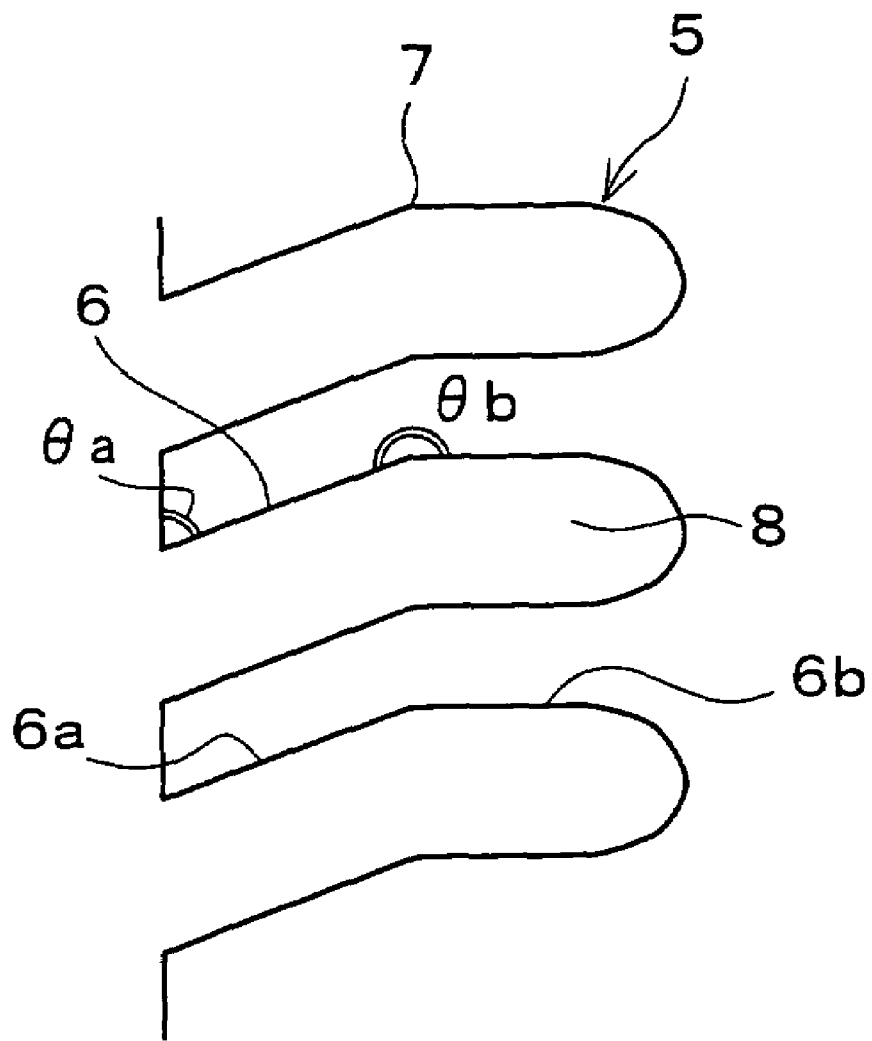
FIG. 7 is a front view showing the structure of essential parts of the holding members of the substrate storage cassette of FIGS. 6(a) and 6(b).
Figure 8:
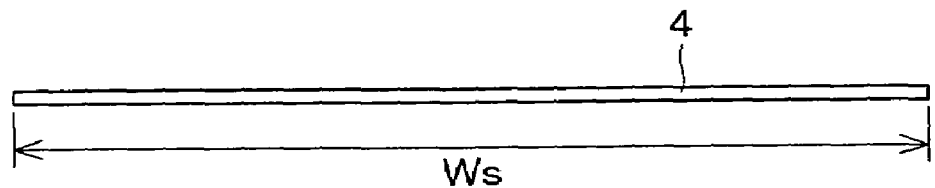
Figure 8:
Figure 8:
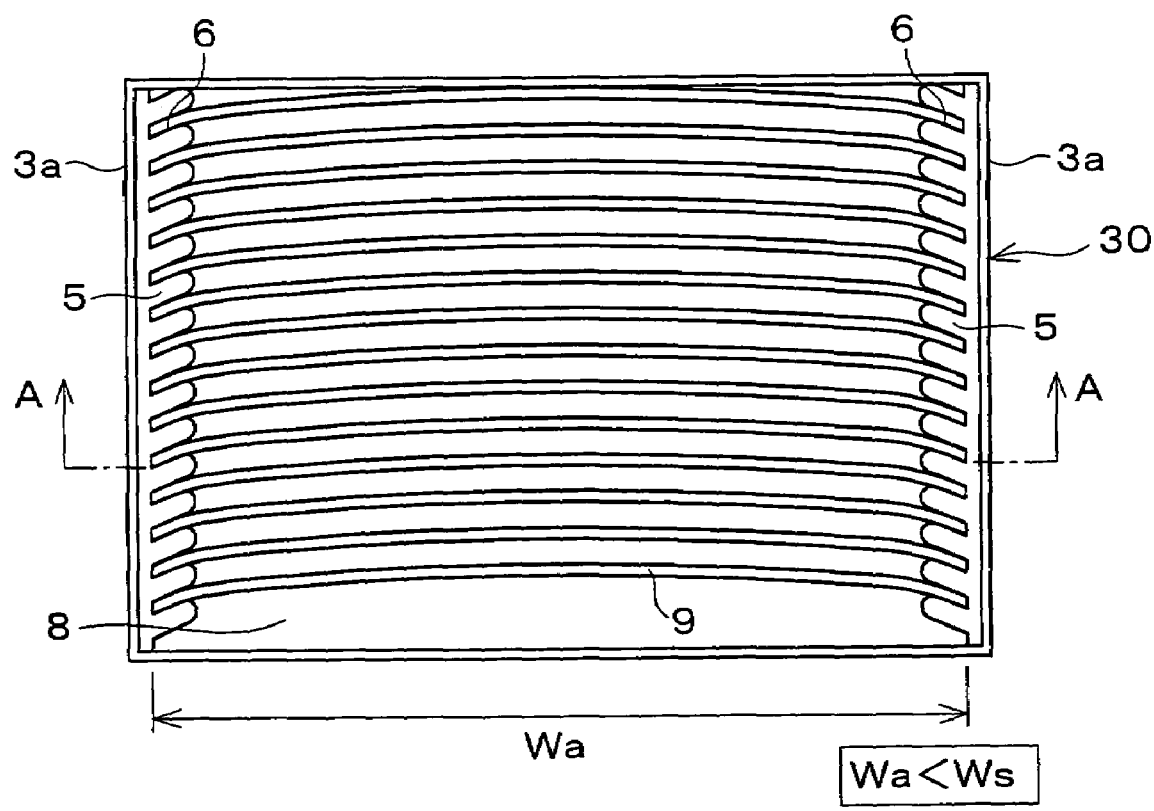
Figure 9:
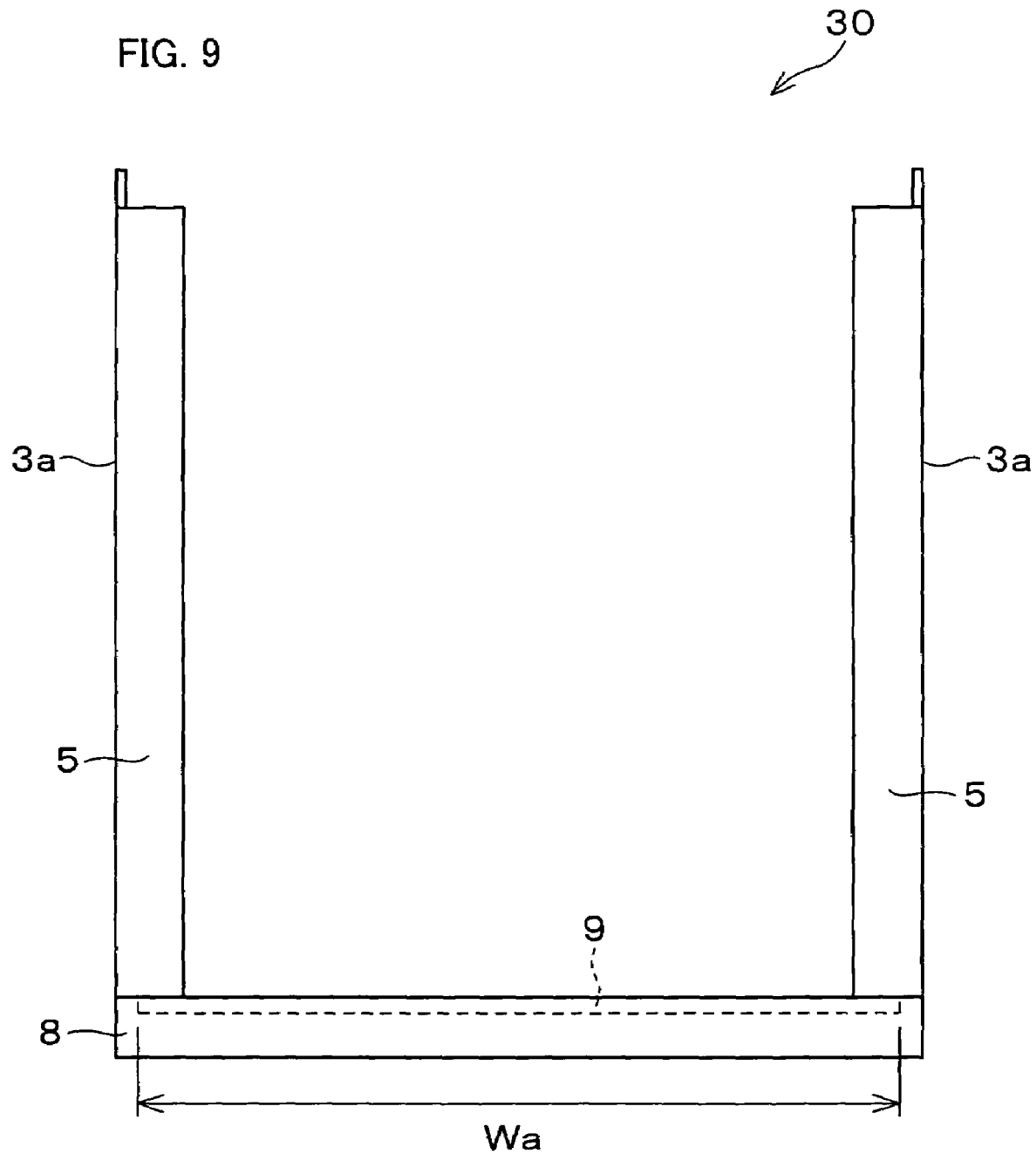
FIG. 9 is a front view of FIG. 8(c) taken along an arrow A-A.
Figure 10:
Figure 10:
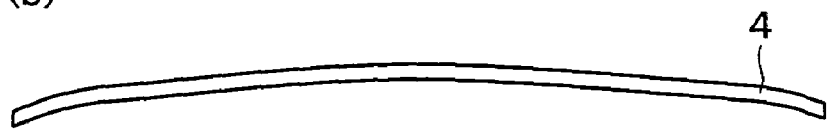
Figure 10:
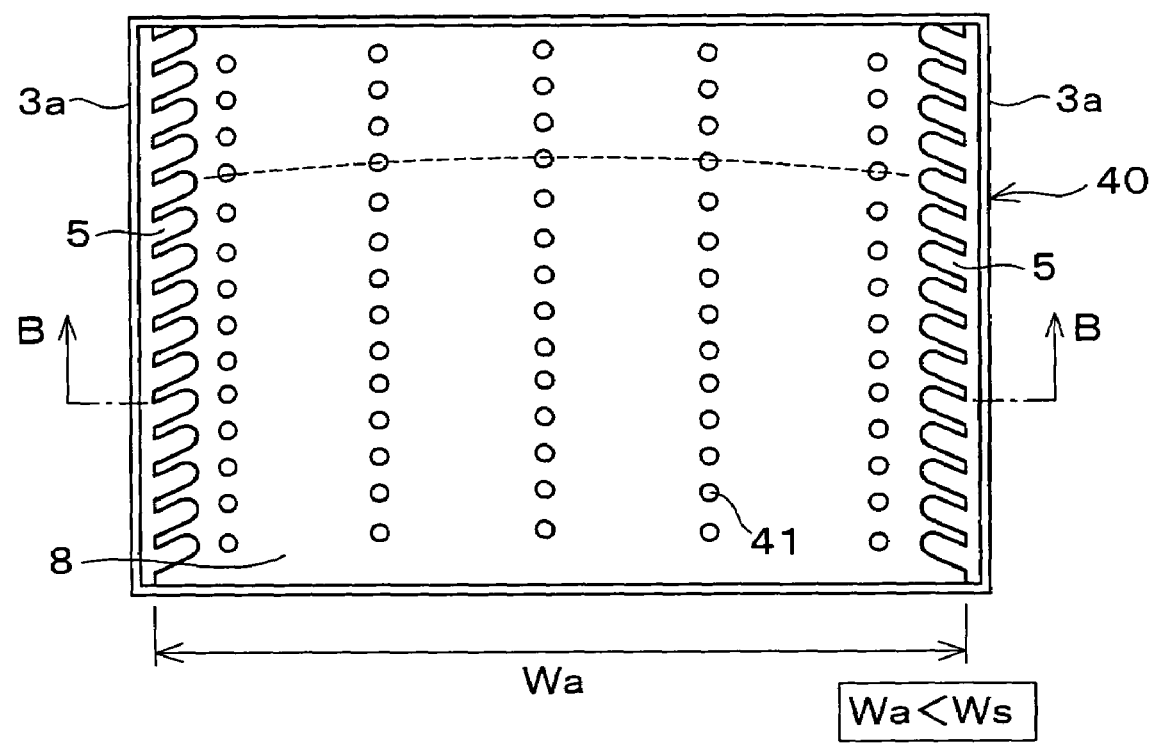

The following descriptions will explain another embodiment of the present invention in reference to FIGS. 6(a) and 6(b) and FIG. 7. For ease of explanation, members (structures) having the same functions as those shown in the drawings pertaining to the first embodiment above will be given the same reference symbols, and explanation thereof will be omitted here.

A substrate storage cassette 20 (corresponding to the storage container main body 1 of the first embodiment) as the flexible substrate storage equipment in accordance with the present embodiment is arranged so as to store the substrates 4 in a lateral direction, and that an interval between connection bars 23a as the pair of opposed members can be increased when inserting the substrates 4 and taking them out in and from the substrate storage cassette 20. For other structures, the substrate storage cassette 20 of the present embodiment is basically the same as those of the first embodiment.

The substrate storage cassette 20 includes eight connection bars 23a which are fixed so as to stand straight up on each of bottom plates 27a and 27b. The substrate storage cassette 20 also includes top plates 28a and 28b disposed so as to be attached on the connection bars 23a which are attached thereon so as to form an outer frame. The connection bars 23a, the bottom plates 27a and 27b, and the top plates 28a and 28b constitute an outer frame. In the present embodiment, at least a pair of opposed connection bars 23a are provided so as to maintain a predetermined interval between them as being supported by the bottom plates 27a and 27b and the top plates 28a and 28b.

The present embodiment is arranged such that respective overall widths of plates 27a and 27b and the top plates 28b and 28b can be adjusted. With this structure, the interval between each pair of opposed connection bars 23a can be increased when inserting the substrate 4.

Specifically, in the state where the substrate 4 is stored in the substrate storage cassette 20, i.e., the overall widths of the bottom plates 27a and 27b and the top plates 28a and 28b are reduced, the substrate storage cassette 20 has an inner width Wc. On the other hand, when inserting the substrate 4 in the substrate storage cassette 20, i.e., when reducing the overall widths of the bottom plates 27a and 27b and the top plates 28a and 28b respectively, the substrate storage cassette 20 has an inner width Wd which is larger than Wc. Here, the cassette inner width Wc and the cassette inner width Wd are defined in the direction of wedging the substrate 4.

In the present embodiment, when the substrate storage cassette 20 has the inner width Wc, the substrate 4 is wedged as being pushed inwards by the connection bars 23a so as to hold the substrate 4 in a form of a curve. Therefore, the substrate length Ws is defined to be shorter than the cassette inner width Wc (substrate length Ws<cassette inner width Wc). The respective cassette inner width Wc and the cassette inner width Wd are the widths in the wedging direction.

According to the present embodiment, on respective opposed inner surfaces of the connection bars 23a which constitute the cassette outer frame member, holding members 5 for holding the substrates 4 (flexible substrates) are formed at equal intervals.

As illustrated in FIG. 6(a) and FIG. 6(b), the bottom plates 27a and 27b and the top plates 28a and 28b are slidably provided. Specifically, the protruded section of the bottom plate 27a can be inserted in the recessed section of the bottom plate 27b. Similarly, the protruded section of the top plate 28a can be inserted in the recessed section of the top plate 28b. The bottom plates 27a and 27b and the top plates 28a and 28b are pulled inwards by springs (not shown) in the direction of reducing the interval between the bottom plates 27a and 27b and the top plates 28a and 28b respectively.

As in the case of the first embodiment, as illustrated in FIG. 7, each substrate holding face 6 of the holding member 5 forms an angle of hold θa other than 90° with respect to the side plates 3a so that each flexible substrate 4 can be held in shape of a curve along the substrate holding face 6. Namely, the substrate holding face 6 of the holding member 5 holds the substrate 4 at an angle θa other than a right angle with respect to the connection plates 3a.

In view of the foregoing, the angle of hold θa is selected to be an angle other than 90°, namely, in a range of 0°<θa<89°, or 91°<θa<180°. In view of the results of experiments (to be explained later), it is preferable that the angle of hold θa be selected in a range of 20° to 75° as in the case of the first embodiment. In order to bend the substrate 4 so that the angle of hold θa falls in a range of 20° to 75°, it is preferable that the substrate length Ws and the cassette inner width Ws hold the relationship of 210/360<Wa/Ws<358/360.

With this structure, it is easy to hold the substrate 4 in a shape of a curve without being damaged, and a load on the substrate 4 and the holding member 5 can be reduced.

As illustrated in FIG. 7, a bending section 7 is formed as each substrate bending section on the substrate holding face 6 of the holding member 5 in accordance with the present embodiment. This bending section 7 forms an angle of bend θb other than 180°. As a result, the bent portion can be provided on the substrate holding face 6.

As a result, on the substrate holding face 6 of the holding member 5, a holding face 6a at a fixed end and a holding face 6b at a free end are formed. Incidentally, the angle of bend θb of the bending section 7 is selected so that the holding face 6b at the free end is formed parallel in the direction of wedging the substrate 4.

Differences in respective functions of the holding face 6a at the fixed end and the holding face 6b at the free end will be explained in the explanations on the storing operations of the substrate storage cassette 20.

Firstly, as illustrated in FIG. 6(a), when storing the cassette 4 in the substrate storage cassette 20, the bottom plates 27a and 27b and the top plates 28a and 28b are extended.

Here, the cassette inner width is selected to be Wd, which is larger than the substrate length Ws. For this reason, in the case of storing the substrate 4 in the substrate storage cassette 20, the respective ends of the flat substrate 4 in the wedging direction are placed on the inner ends of the substrate holding faces 6. Here, respective holding faces 6b on the free end sides of the flat substrate 4 in the wedging direction are provided substantially parallel to the wedging direction of the substrate 4. Therefore, the flat substrate 4 is maintained flat, and the back surface thereof contacts the holding face 6b on each free end side. As a result, the substrate 4 is held on each holding face 6b on the free end side of the substrate holding face 6.

As a result, the flat substrate 4 can be inserted to the back face of the substrate storage cassette 20 with ease by sliding the flat substrate 4.

Next, in this state, the overall widths of the bottom plates 27a and 27b and the top plates 28a and 28b are reduced respectively. Incidentally, the overall widths of the bottom plates 27a and 27b and the top plates 28a and 28b are reduced automatically by springs (not shown). Therefore, in order to prevent the bottom plates 27a and 27b and the top plates 28a and 28b from sliding to reduce the overall widths immediately after inserting the substrate 4, it may be arranged so as to lock these plates with lock pins (not shown).

As illustrated in FIG. 6(b), in the state where the overall widths of the bottom plates 27a and 27b and the flat plates 28a and 28b are reduced completely to the minimum interval, the substrate 4 is wedged as being pushed by the pair of opposed connection bars 23a. As a result, the substrate 4 is inserted onto the holding faces 6a to the fixed ends of the substrate holding face 6. Here, the cassette inner width Wc is selected to be shorter than the substrate length Ws. Therefore, the substrate 4 is held in the state where the back surface of the substrate 4 contacts the holding faces 6a at the fixed ends at its outer ends.

Here, the substrate 4 is wedged as being pushed by the opposed connection bars 23a in a form of a curve. Therefore, the angle of hold θa is determined according to the curve. Incidentally, when the substrate 4 is to be taken out of the cassette 20, the substrate 4 is formed back to the flat state shown in FIG. 6(a).

With respect to the substrate storing cassette 20, an experiment was performed by inserting two plastic substrates as in the case of the first embodiment, in the substrate storage cassette 20 as illustrated in FIG. 6(a) and FIG. 6(b), under the following conditions:

Cassette inner width Wd when inserting the substrate 4: 370 mm;

Cassette inner width Wc in the substrate holding mode: 340 mm;

Width between grooves Wh of holding members 5: 9 mm;

Angle of hold θa: 60°;

Angle of bend θb: 210°;

Length of free end side holding face 6b: 20 mm; and

Length of fixed end side holding face 6a: 10 mm.

As a result of this experiment, it was found that both of the substrates 4 could be stored in the substrate storage cassette 20 under stable conditions, without having such problem that respective substrates contact each other.

The storage container main body 1 having the foregoing structure is therefore suited for storing flexible plastic substrates.

In the present embodiment, the bending sections 7 are formed respectively on the substrate holding faces 6 of the holding sections 5 of the pair of opposed connection bars 23a. However, the present invention is not intended to be limited to be above, and, for example, the structure wherein the bending section 7 is formed on the substrate holding face 6 of the holding section 5 of either one of the opposed connection bars 23a may be adopted. With this structure, the operations of inserting and taking out the substrates 4 in and from the substrate storage cassette 20 can be performed with ease as compared to the case without the substrate holding face 6 of the holding sections 5 of the pair of opposed connection bars 23a.

The present embodiment has been explained through the case of the structure wherein the substrates 4 are stored in the storage container main body 1 in a lateral direction with respect to the substrate storage cassette 20. However, the present embodiment is not intended to be limited to the foregoing structure, and, for example, the structure wherein the substrate 4 is stored in the substrate storage cassette 20 in an upright position may be adopted. With this structure, it is possible to store the substrate 4 at an upright position in a curved shape, and the overall lengths of the bottom plates 27a and 27b and the top plates 28a and 28b can be increased extended respectively when inserting and taking out the substrates 4 in and from the substrate storage cassette 20 so as to ease the operations of inserting and taking out the substrates 4 in and from the substrate storage cassette 20.

As described, according to the substrate storage cassette 20 of the present embodiment, the interval (cassette inner width) between the pair of opposed substrates 23a is adjusted, i.e., the cassette inner width Wc is increased to the cassette inner width Wd when inserting and taking out the substrate 4 in and from the substrate storage cassette 20. With this structure, it is possible to insert the substrate 4 in a flat shape and to store it in a form of a curve.

According to the foregoing structure wherein the substrate 4 can be inserted in a flat shape, it is possible to insert and take out in and from the substrate storage cassette 20 with ease as compared to the case of inserting the substrate 4 in a form of a curve.

Furthermore, the substrate storage cassette 20 of the present embodiment has the bending section 7 on the holding section 5 of at least one of opposed connection bars 23a, and it is therefore possible to set the free end side of each holding section 5 to be formed parallel to the direction of inserting the substrate 4.

When inserting the substrate 4, the cassette inner width Wc between the pair of opposed connection bars 23a is increased, and it is possible to surely insert the substrate 4 in a flat shape and to store it in a form of a curve. As a result, the operation of inserting and taking out the substrate 4 in and from the cassette 20 can be performed with ease under stable conditions.

Third Embodiment

The following descriptions will explain still another embodiment of the present invention in reference to FIGS. 8(a) to 8(c) and FIG. 9. For ease of explanation, members (structures) having the same functions as those shown in the drawings pertaining to the first embodiment and second embodiment above will be given the same reference symbols, and explanation thereof will be omitted here.

The flexible substrate container in accordance with the present embodiment is a modification of the storage container main body 1 of the first embodiment.

Namely, as illustrated in FIGS. 8(a) to 8(c) and FIG. 9, the storage container main body 30 (flexible substrate storage equipment) in accordance with the present embodiment is arranged so as to include curved grooves 9 formed as insertion grooves in a curved shape on a base surface 8 (base plate) of the storage container main body 30. Other than the above, the storage container main body 30 in accordance with the present embodiment is the same as the storage container main body 1 in accordance with the first embodiment.

Specifically, a plurality of curved grooves 9 are formed on the base surface 8, and each groove 9 in a curved shape is formed between opposed holding members 5 in such a manner that a single curved groove 9 is formed for each substrate holding face 6 along a curved shape of the substrate 4 (plastic substrate).

With this structure, each substrate 4 is inserted in each curved groove 9 formed on the base surface 8.

In the state where the substrate 4 is stored in the storage equipment main body 30, the opposed two sides of the substrate 4 are held by the substrate holding faces 6 of the holding members 5 on the side plates 3a. Furthermore, another side of the substrate 4 is held by the curved groove 9. Namely, three sides of the substrate 4 are supported in total. As a result, the substrate 4 can be more stably stored in the storage equipment main body 30.

For example, the experiment was conducted by setting the following conditions in addition to the conditions adopted in the first embodiment. Specifically, two plastic substrates 4 were stored on respective substrate holding face 6 of the holding members 5 on respective inner side plates 3a.

Depth of curved groove 9: 3 mm; and

Size of Substrate 4 360 mm×465 mm.

As a result, both of the substrates 4 were stably self-supported in the storage equipment main body 30 without contacting each other.

As described, in the storage equipment main body 30 in accordance with the present embodiment, curved grooves 9 are formed on the base surface 8 for guiding the substrate 4 in a curved shape. Therefore, when storing the substrate 4, by inserting the depth end side of the substrate 4 in the direction of inserting the substrate 4 in the groove 9, the substrate 4 can be held also at the depth end in the direction of inserting the substrate 4. As a result, the substrate 4 can be stored under table conditions.

Fourth Embodiment

The following descriptions will explain still another embodiment of the present invention in reference to FIGS. 10(a) to 10(c), and FIG. 11. For ease of explanation, members (structures) having the same functions as those shown in the drawings pertaining to the first embodiment and third embodiment above will be given the same reference symbols, and explanation thereof will be omitted here.

The flexible substrate container in accordance with the present embodiment is a modification of the storage container main body 1 of the first embodiment, and has a similar structure to that adopted in the third embodiment.

Namely, as illustrated in FIGS. 10(a) to 10(c) and FIG. 11, a storage equipment main body 40 (flexible substrate storing member) in accordance with the present embodiment is arranged so as to include a plurality of protrusions 41 aligned in a shape of a curve on a base surface 8 (base plate) of the storage equipment main body 40 in replace of the grooves 9 in a curved shape adopted in the third embodiment. Other than the above, the storage equipment main body 40 in accordance with the present embodiment has the same structure as the storage container main body 1 in accordance with the present embodiment.

Specifically, the storage equipment main body 40 in accordance with the present embodiment includes a plurality of protrusions 41 aligned in a curved shape which are formed on the base surface 8 to fit along the shape of a curve of the substrate 4.

In the present embodiment, five protrusions 41 are formed in the interval between opposed holding members 5. However, the present invention is not intended to limit the number of protrusions to five, and the protrusions 41 may be formed in any number greater than two.

Figure 11:
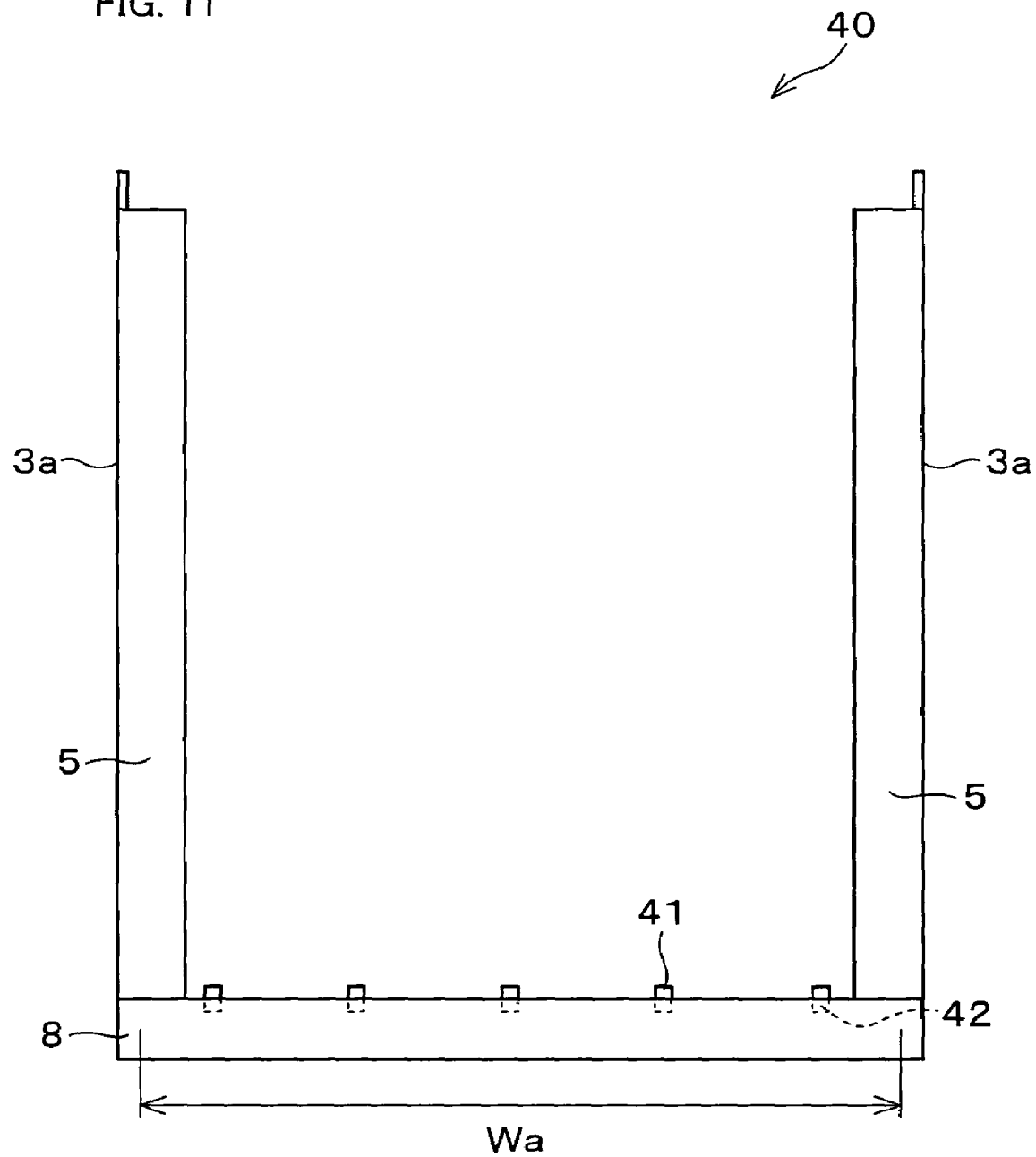
FIG. 11 is a front view of FIG. 10(c) taken along an arrow B-B.
Figure 16:
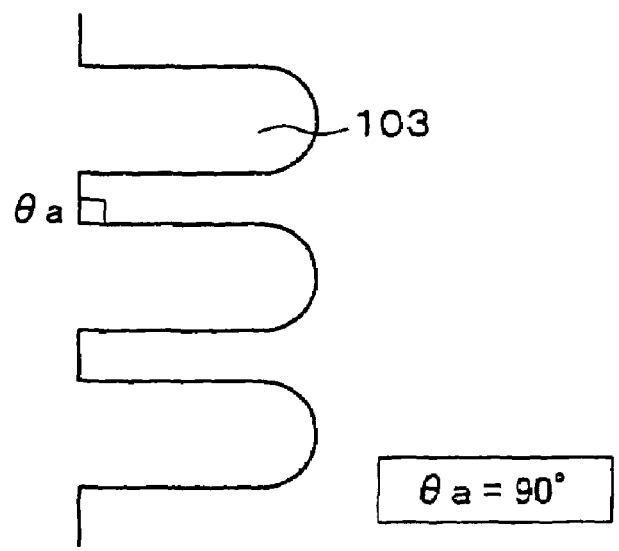
FIG. 16 is a plan view illustrating an angle of a substrate holding face of the holding member provided in the storage container main body.
Figure 17:
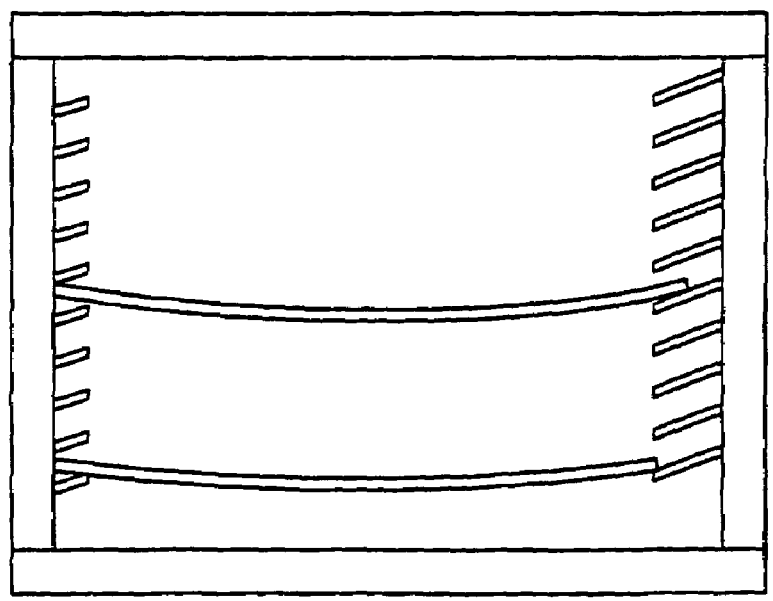
FIG. 17 is a front view illustrating another conventional storage container main body.

As illustrated in FIG. 11, these protrusions 41 may be formed by inserting the protrusions 41 into holes 42 respectively. In this way, the protrusions 41 can be made detachable, and the positions and the number of the protrusions 41 can be selected by selecting the positions and the number of holes 42 formed in the base surface 8. Incidentally, by forming the holes 42 in a large number, the protrusions 41 can be inserted into holes 42 as desired. As a result, when storing the substrate 4, the curve formed by the plurality of protrusions 41 in alignment fitting along the curve of the substrate 4 can be realized by selecting the positions of the protrusions 41.

In the state where the substrate 4 is stored in the storage equipment main body 40, the opposed two sides of the substrate 4 are held by the substrate holding faces 6 of the holding members 5 on the side plates 3a. Furthermore, another side of the substrate 4 is held by the protrusions 41 aligned in a curve. Namely, three sides of the substrate 4 are supported in total. As a result, the substrate 4 can be stored in the storage equipment main body 40 under stable conditions.

For example, the experiment was conducted by setting the following conditions in addition to the conditions adopted in the first embodiment. Specifically, two plastic substrates 4 were stored on respective substrate holding faces 6 of the holding members 5 on respective inner side plates 3a. As a result, both of the substrates 4 were stably self-supported in the storage equipment main body 40 without contacting each other.

Height of protrusion 41: 3 mm; and

Size of substrate 4 360 mm×465 mm.

As described, in the storage equipment main body 40 in accordance with the present embodiment, protrusions 41 aligned in a form of a curve are formed on the base surface 8 for guiding the substrate 4 in a curved shape. Therefore, when storing the substrate 4, by inserting the substrate 4 so that the bottom surface at the depth end side of the substrate 4 in the direction of inserting the substrate 4 contacts the protrusions 41, the substrate 4 can be supported also at the depth end side in the direction of inserting the substrate 4. As a result, the substrate 4 can be more stably stored under table conditions.

Incidentally, the present invention is not intended to be limited to the above-explained preferred embodiments, and various modifications are permitted within the scope of the claims, and for example, other embodiments in combination of technical means adopted in different embodiments are also considered to fall in the scope of the present invention. In the present inventions, the flexible substrate storage equipment may be made up of the storage equipment main body and the substrate.

EXAMPLE

In this example, experiments for obtaining an optimal value for the angle of hold θa will be explained.

In this example, a compressive force applied to the substrate 4 in an axial direction to change the width of the substrate (=side in lateral direction 360 mm), and an angle of a side in a longitudinal direction was measured.

In this experiment, the following two kinds of substrates are adopted.

[Kind of Substrate]
  Plastic Substrate: one
  Glass substrate: one

[Size of Substrate]
  Plastic Substrate: 0.2 mm in thickness.
  Glass Substrate: 0.7 mm in thickness.
  Size of Substrate 4 360 mm×465 mm (in the same size as the substrate 4 adopted in the above example).

The method of experiment and measurement will be explained in reference to FIGS. 12(a), 12(b) and 12(c).

1. A plastic substrate is placed in a set stand at an upright position. In this state, one of the sides (360 mm) of the plastic substrate contacts the set stand.

2. Then, forces are applied to two sides (465 mm) in the longitudinal direction of the substrate. As a result, the substrates are formed in a form of a curve.

3. As forces are increased, the substrate is more sharply bent as linear→arcurate→U-shaped.

4. Despite the changes in the shape of the sides in the lateral direction, the length of the arc is fixed at 360 mm. On the other hand, the length of the chord of a straight line connecting the side in the longitudinal direction and the side in the longitudinal direction is selected to be smaller than 360 mm.

5. Respective angles (corresponding to angles of hold θa) of the substrate with changes in length of the chord (360 mm→94 mm) are measured.

6. The above experiment and measurement (1 to 5) were performed also with respect to the glass substrate. Incidentally, the glass substrate has almost no flexibility, and thus the length of the chord could not be changed from 360 mm→358 mm. Specifically, an attempt was made to reduce the length of the chord to 355 mm, and the substrate was cracked.

The results of the foregoing experiment and measurement with respect to the plastic substrate are as shown in FIG. 13, and the results with respect to the glass substrate are as shown in FIG. 14.

As a result of the foregoing experiments, it is preferable that the angle of hold θa falls in a range of from 20° to 75°.

Incidentally, in order to bend the substrate 4 so that the angle of hold θa falls in a range of 20° to 75°, it is preferable that the substrate length Ws and the storage equipment main body Wa has a relationship of 210/360<Wa/Ws<358/360. With this condition, the substrate 4 can be stably self-supported.

As described, the flexible substrate storage equipment of the present invention is arranged such that an interval between the pair of opposed members in its storage state is shorter than the length of the substrate to be wedged in the wedging direction.

The flexible substrate storage method of the present invention is arranged so as to set an interval between a pair of opposed members to be shorter than the length of the substrate to be wedged in the wedging direction when the substrate is stored.

With the foregoing arrangement, since the interval between the pair of opposed members in the state where the substrate is stored is shorter than the length of the substrate to be wedged in the wedging direction. Therefore, when storing the substrate, the substrate is inevitably formed in a curve.

As a result, it is possible to realize the flexible substrate storage equipment and the flexible substrate storage method that can store the substrate in a form of a curve with ease with a simple structure.

The storage equipment main body of the present invention includes a plurality of holding members provided at each of the opposed members, for holding the plurality of substrates in alignment.

With this structure wherein the plurality of holding members are provided at each of the opposed members, it is possible to neatly store the plurality of substrates as aligned.

The storage equipment main body of the present invention is provided with the holding members for holding the substrates so as not to form a right angle with respect to the opposed members.

With this structure wherein the holding members are formed for holding the substrates so as not to form a right angle, by selecting the angle formed between the pair of opposed members and the holding members to be an angle other than 90°, it is possible to hold the substrate in a form of a curve along the holding members. As a result, the substrate can be maintained in a form of a curve with ease, and a load on respective contact portions of the substrate and the holding section can be reduced. Incidentally, the generation of dust particles due to a friction between contact faces can be suppressed.

The flexible substrate storage equipment of the present invention may be arranged such that the predetermined interval between the pair of opposed members can be increased when inserting and taking out the plurality of substrates in and from the flexible substrate storage equipment.

With this structure wherein the predetermined interval between the pair of opposed members can be changed when inserting or taking out the plurality of substrates in and from the flexible substrate storage equipment, the substrate can be inserted in a flat state and can be stored in a form of a curve.

According to the foregoing structure wherein the substrate can be inserted in a flat shape, it is possible to insert and take out the substrate with ease as compared to the case of inserting the substrate in a curved shape.

The flexible substrate storage equipment of the present embodiment is arranged such that a bending section for bending the substrate is formed on a holding member of at least either one of the pair of opposed members.

With this structure, respective holding members on the free end sides can be formed substantially parallel to the direction of inserting the substrate. As a result, when inserting and taking out the substrate, an interval between the opposed members can be increased, and it is possible to surely insert in a flat state the substrate that is to be stored in a shape of a curve, thereby achieving the effect of surely inserting and taking out the substrate with ease.

The flexible substrate storage equipment of the present invention may be arranged such that a base plate is attached to the pair of opposed substrates at an end in the direction of inserting the substrate., and insertion grooves are formed in the base plate for guiding the substrate along a curve.

With this structure, by inserting the substrate so that the side at the back of the substrate in the direction of inserting the substrate to be bit in a groove, it is possible to have a holding function also with respect to the back side of the substrate in the direction of inserting the substrate, thereby permitting the substrate to be more stably stored.

The flexible substrate storage equipment of the present invention may be arranged so as to include a base plate at a depth end of the pair of opposed members in a direction of inserting the plurality of substrates; and a plurality of protrusions are formed on the base plate for guiding said plurality of substrates along a curve.

With this structure, when storing the substrate, by inserting the substrate so that the bottom surface at the depth end side of the substrate in the direction of conditions, it is possible to have a holding function also with respect to the back side of the substrate in the direction of inserting the substrate, thereby permitting the substrate to be more stably stored.

The flexible substrate container of the present invention may be arranged so as to store the substrate at an upright position.

With this structure, when storing the substrate in a flat shape, by bending it in a form a curve, the rigidity of the substrate can be increased. It is therefore possible to make the substrate to be self supported under stable conditions. In particular, this structure is effective for carrying the substrates 4 stored in the storage equipment main body.

The foregoing flexible substrate storage equipment of the present invention may be arranged such that the pair of opposed members are flat plates.

With this structure, the flexible substrate storage equipment of the present invention can be formed in a flexible substrate container. As a result, the flexible substrate storage equipment that is easy to carry can be realized.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A flexible substrate storage equipment comprising:
    at least a pair of opposed members that constitute an outer frame of a storage equipment main body,
    wherein said pair of opposed members are disposed so as to maintain a predetermined interval to wedge a plurality of flexible substrates in between to hold them in a shape of a curve,
    wherein each of said pair of opposed members includes a plurality of holding members for holding the plurality of flexible substrates in alignment, said plurality of holding members in a pair being spaced apart from each other,
    wherein each of said holding members has a single finger;
    wherein said plurality of substrates do not form a right angle with respect to said pair of opposed members, and wherein the holding members are angled so as to define an angle which is not a right angle between each holding member and the corresponding one of the opposed members, and each of the flexible substrates contacts both of the pair of opposed members, and wherein each of the plurality of flexible substrates is stored along and between adjacent ones of the plurality of holding members, and the adjacent ones of the plurality of holding members hold each of the plurality of flexible substrates; and
    wherein each of said holding members on each of the opposed members is angled upwardly and has a single finger, and said pair of opposed members are disposed so as to maintain a predetermined interval to wedge a plurality of flexible substrates in between to hold them in a shape of a curve so that the flexible substrates contact the opposed members and are bowed upwardly.

2. The flexible substrate storage equipment as defined in claim 1, wherein: said predetermined interval between said pair of opposed members in a state of holding said plurality of flexible substrates is shorter than a length of said plurality of substrates in a holding direction.

3. The flexible substrate storage equipment as set forth in claim 1, wherein:
    said predetermined interval between said pair of opposed members can be increased when placing said plurality of substrates and taking them in and out said flexible substrate storage equipment.

4. The flexible substrate storage equipment as set forth in claim 3, wherein:
    said holding member of at least one of said pair of opposed members includes a curved section for each of said plurality of substrates.

5. The flexible substrate storage equipment as set forth in claim 1, wherein:
    said storage equipment main body includes a base plate at an depth end of said pair of opposed members in a direction of inserting said plurality of substrates; and
    an insertion groove is formed in said base plate for guiding said plurality of substrates along a curve.

6. The flexible substrate storage equipment as set forth in claim 1, wherein:
    said storage equipment main body includes a holding member provided at each of said pair of opposed members, for holding said plurality of substrates in alignment, and
    an insertion groove for guiding said plurality of substrates along a curve is formed in a base plate provided at a back end in a direction of inserting said plurality of substrates.

7. The flexible substrate storage equipment as set forth in claim 1, wherein:
    said storage equipment main body includes a holding member provided with a substrate bending section on at least one of said pair of opposed members, and an insertion groove is formed in said base plate for guiding said plurality of substrates along a curve; and
    an insertion groove for guiding said plurality of substrates along a curve is formed in a base plate provided at a back end in a direction of inserting said plurality of substrates.

8. The flexible substrate storage equipment as set forth in claim 1, wherein:
said storage equipment main body includes a base plate at an depth end of said pair of opposed members in a direction of inserting said plurality of substrates; and
a plurality of protrusions are formed on said base plate for guiding said plurality of substrates along a curve.

9. The flexible substrate storage equipment as set forth in claim 1, wherein:
said storage equipment main body includes a holding member provided at each of said pair of opposed members, for holding said plurality of substrates in alignment, and
a plurality of protrusions for guiding said plurality of substrates along a curve are formed in a base plate provided at a back end in direction of inserting said plurality of substrates.

10. The flexible substrate storage equipment as set forth in claim 1, wherein:
said storage equipment main body includes a holding member provided with a substrate bending section on at least one of said pair of opposed members, and an insertion groove is formed in said base plate for guiding said plurality of substrates along a curve; and
a plurality of protrusions for guiding said plurality of substrates along a curve are formed in a base plate provided at a back end in direction of inserting said plurality of substrates.

11. The flexible substrate storage equipment as set forth in claim 1, wherein:
said plurality of substrates are stored in a stand position.

12. The flexible substrate storage equipment as set forth in claim 1, wherein:
said plurality of substrates are flat plates.

13. The flexible substrate storage equipment of claim 1, wherein each of the holding members consists of a single finger so that immediately adjacent holding members do not contact each other.

14. The flexible substrate storage equipment as set forth in claim 2, wherein:
said storage equipment main body includes a base plate at an depth end of said pair of opposed members in a direction of inserting said plurality of substrates; and
an insertion groove is formed in said base plate for guiding said plurality of substrates along a curve.

15. The flexible substrate storage equipment as set forth in claim 2, wherein:
said storage equipment main body includes a holding member provided at each of said pair of opposed members, for holding said plurality of substrates in alignment, and
an insertion groove for guiding said plurality of substrates along a curve is formed in a base plate provided at a back end in a direction of inserting said plurality of substrates.

16. The flexible substrate storage equipment as set forth in claim 2, wherein:
said storage equipment main body includes a holding member provided with a substrate bending section on at least one of said pair of opposed members, and an insertion groove is formed in said base plate for guiding said plurality of substrates along a curve; and
an insertion groove for guiding said plurality of substrates along a curve is formed in a base plate provided at a back end in a direction of inserting said plurality of substrates.

17. The flexible substrate storage equipment as set forth in claim 2, wherein:
said storage equipment main body includes a base plate at an depth end of said pair of opposed members in a direction of inserting said plurality of substrates; and
a plurality of protrusions are formed in said base plate for guiding said plurality of substrates along a curve.

18. The flexible substrate storage equipment as set forth in claim 2, wherein:
said storage equipment main body includes a holding member provided at each of said pair of opposed members, for holding said plurality of substrates in alignment, and
a plurality of protrusions for guiding said plurality of substrates along a curve are formed in a base plate provided at a back end in direction of inserting said plurality of substrates.

19. The flexible substrate storage equipment as set forth in claim 2, wherein:
said storage equipment main body includes a holding member provided with a substrate bending section on at least one of said pair of opposed members, and an insertion groove is formed in said base plate for guiding said plurality of substrates along a curve; and
a plurality of protrusions for guiding said plurality of substrates along a curve are formed in a base plate provided at a back end in direction of inserting said plurality of substrates.

20. The flexible substrate storage equipment as set forth in claim 2, wherein:
said plurality of substrates are stored in a stand position.

21. The flexible substrate storage equipment as set forth in claim 2, wherein:
said plurality of substrates are flat plates.

22. A storing method of flexible substrates,
wherein a plurality of flexible substrates are wedged by a pair of opposed members which constitute an outer frame of a storage equipment main body,
wherein each of said opposed members includes a plurality of holding members for respectively holding flexible substrates, and wherein each of the holding members consists of a single finger so that immediately adjacent holding members do not contact each other; and
wherein the holding members are angled so as to define an angle of not a right angle between each holding member and the corresponding one of the opposed members, and each of the flexible substrates contacts both of the pair of opposed members, and wherein each of the plurality of flexible substrates is stored along and between adjacent ones of the plurality of holding members, and the adjacent ones of the plurality of holding members hold each of the plurality of flexible substrates; and
wherein each of said holding members on each of the opposed members is angled upwardly and consists of a single finger, and said pair of opposed members are disposed so as to maintain a predetermined interval to wedge a plurality of flexible substrates in between to hold them in a shape of a curve so that the flexible substrates contact the opposed members and are bowed upwardly.

23. The storing method of flexible substrates as set forth in claim 22, said predetermined interval between said pair of opposed members in a state of holding said plurality of flexible substrates is shorter than a length of said plurality of substrates in a holding direction.

* * * * *